United States Patent [19]
Deliyannides et al.

[11] Patent Number: 5,760,618
[45] Date of Patent: Jun. 2, 1998

[54] PROCESS COMPENSATED INTEGRATED CIRCUIT OUTPUT DRIVER

[75] Inventors: George Deliyannides, New Westminster; Kris Iniewski, Coquitlam, both of Canada

[73] Assignee: PMC-Sierra, Inc., Burnaby, Canada

[21] Appl. No.: 664,119

[22] Filed: Jun. 14, 1996

[51] Int. Cl.$^6$ .................................................. H03K 3/00
[52] U.S. Cl. ...................... 327/108; 327/170; 327/206; 327/437; 326/87
[58] Field of Search .................... 327/108–112, 170, 327/374–377, 205, 206, 427, 434, 437; 326/85, 87

[56] References Cited

U.S. PATENT DOCUMENTS

| | | | |
|---|---|---|---|
| 4,539,489 | 9/1985 | Vaughn | 327/206 |
| 5,191,245 | 3/1993 | Kang | 327/170 |
| 5,532,630 | 7/1996 | Wagonner et al. | 327/112 |
| 5,594,361 | 1/1997 | Campbell | 327/206 |

Primary Examiner—Timothy P. Callahan
Assistant Examiner—Kenneth B. Wells
Attorney, Agent, or Firm—Oyen Wiggs Green & Mutala

[57] ABSTRACT

An integrated circuit output driver which reduces the effect of power supply and/or integrated circuit fabrication process variations on signal propagation delay. The output driver produces an output signal $V_{out}$ as an increased drive strength replica of an input signal $V_{in}$. A pre-driver receives $V_{in}$ and produces an intermediate, inverted replica $V_{int}$ thereof. A driver is electrically connected to the pre-driver's output to receive $V_{int}$. $V_{out}$ appears at the driver's output as an inverted, strengthened replica of $V_{int}$. A first feedback circuit electrically connected between the driver's input and output applies a pull-down signal to the driver's input in response to a falling edge of $V_{in}$, with the pull-down signal's strength varying in inverse proportion to propagation delay of the falling edge of $V_{in}$. A second feedback circuit electrically connected between the driver's input and output applies a pull-up signal to the driver's input in response to a rising edge of $V_{in}$, with the pull-up signal's varying in inverse proportion to propagation delay of the rising edge of $V_{in}$.

15 Claims, 12 Drawing Sheets

PROCESS COMPENSATED INTEGRATED CIRCUIT OUTPUT DRIVER

FIELD OF THE INVENTION

This application pertains to an integrated circuit output driver having compensation circuitry which reduces the effect of power supply and/or integrated circuit fabrication process variations on signal propagation delay.

BACKGROUND OF THE INVENTION

Integrated circuits are commonly fabricated with a large number of pins, many of which serve as conductors for output signals produced by the integrated circuit. The pins simultaneously conduct different output signals to loads having load characteristics which are not always known to the integrated circuit designer. This can place heavy burdens on the integrated circuit's power supply, causing "glitches" in the form of power supply voltage spikes which can precipitate logic errors in digital circuitry, noise injection into analog circuits, etc.

Integrated circuit fabrication processes are subject to many different types of process variation. Such variations invariably occur between different silicon wafers and/or between different dice fabricated from a single wafer. Process variations may result in differences in the propagation delays of electronic signals processed through separate, supposedly "identical" circuits. The propagation delay of a switching element in a "slow" process can be approximately double that in a "fast" process. In this context, a "slow" process is a fabrication process which yields switching elements exhibiting significantly greater propagation delays than those exhibited by switching elements fabricated in a "fast" process. Propagation delays also vary with variations in power supply levels.

In a typical integrated circuit, an output driver is associated with each of the integrated circuit pins which conduct output signals from the integrated circuitry contained within the chip. A driver boosts the strength of an output signal, so that the signal can drive a larger off-chip load. The propagation delay of the drivers on an integrated circuit may vary significantly, due to process variations which unavoidably occur during fabrication of the drivers and/or due to power supply variations.

The design of an output driver must be based on a slow process to ensure correct timing of the driver's output signals. But, improving the driver's performance in slow conditions necessarily increases the driver's speed of operation in fast conditions, which can cause several problems. For example, simultaneous switching output (SSO) problems can occur as different drivers on the same integrated circuit simultaneously attempt to change state. This can cause spikes in the power supply or ground signals (ground bounce), with the spike severity increasing in faster conditions). Ground bounce problems can cause difficulties in interfacing with other integrated circuits. Noise coupling problems can also be caused, impairing the operation of analog circuitry internal to the integrated circuit containing the improved output driver. Duty cycle distortions can also be caused by differences in propagation delays between a signal's rising and falling edges.

To alleviate these problems, the present invention reduces the sensitivity of an output driver to process and/or power supply variations by providing compensation circuitry. The circuitry compensates for process and/or power supply variations, without compromising the driver's normal operational characteristics, and in such a way that signal propagation delays are much less sensitive to such variations. The compensation circuitry requires very few transistors, thus minimizing the area occupied by the output driver. Only elements available in a standard CMOS integrated circuit fabrication process are required (no bipolar transistors are required).

SUMMARY OF THE INVENTION

In accordance with the preferred embodiment, the invention provides an integrated circuit output driver for producing an output signal $V_{out}$ as an increased drive strength replica of an input signal $V_{in}$. A pre-driver receives $V_{in}$ and produces an intermediate, inverted replica $V_{int}$ thereof. A driver is electrically connected to the pre-driver output, such that the driver's input receives $V_{int}$, $V_{out}$ appears at the driver's output as an inverted, strengthened replica of $V_{int}$. A first feedback circuit electrically connected between the driver's input and output applies a pull-down signal to the driver's input in response to a falling edge of $V_{in}$, with the pull-down signal's strength varying in inverse proportion to propagation delay of the falling edge of $V_{in}$. A second feedback circuit electrically connected between the driver's input and output applies a pull-up signal to the driver's input in response to a rising edge of $V_{in}$, with the pull-up signal's varying in inverse proportion to propagation delay of the rising edge of $V_{in}$.

The first feedback circuit may have a first normally on switch biased off by a falling edge of $V_{out}$, such that the first feedback circuit conducts a logic high signal from the input to the output port of the first switch before $V_{out}$ switches to a logic low state, thereby producing a positive pulse output signal $V_{refn}$ at the first switch's output port. The second feedback circuit may have a second normally on switch biased off by a rising edge of $V_{out}$, such that the second feedback circuit conducts a logic low signal from the input to the output port of the second switch before $V_{out}$ switches to a logic high state, thereby producing a negative pulse output signal $V_{refp}$ at the second switch's output port.

The first feedback circuit may also have a third switch electrically connected between the first switch's output port and the driver's input, such that the third switch is biased on by $V_{refn}$ to pull the driver's input down with a strength proportional to the strength of $V_{refn}$. The second feedback circuit may similarly have a fourth switch electrically connected between the second switch's output port and the driver input, such that the fourth switch is biased on by $V_{refp}$ to pull the driver's input up with a strength proportional to the strength of $V_{refp}$.

A first delay element may be included in the first feedback circuit to delay biasing of the first switch off until after the first switch is biased on and $V_{out}$ has switched to its logic low state. A second delay element may be similarly included in the second feedback circuit to delay biasing of the second switch off until after the second switch is biased on and $V_{out}$ has switched to its logic high state.

The switches are preferably field effect transistors.

DETAILED DESCRIPTION OF THE PREFERRED EMBODIMENTS

Figure 1:
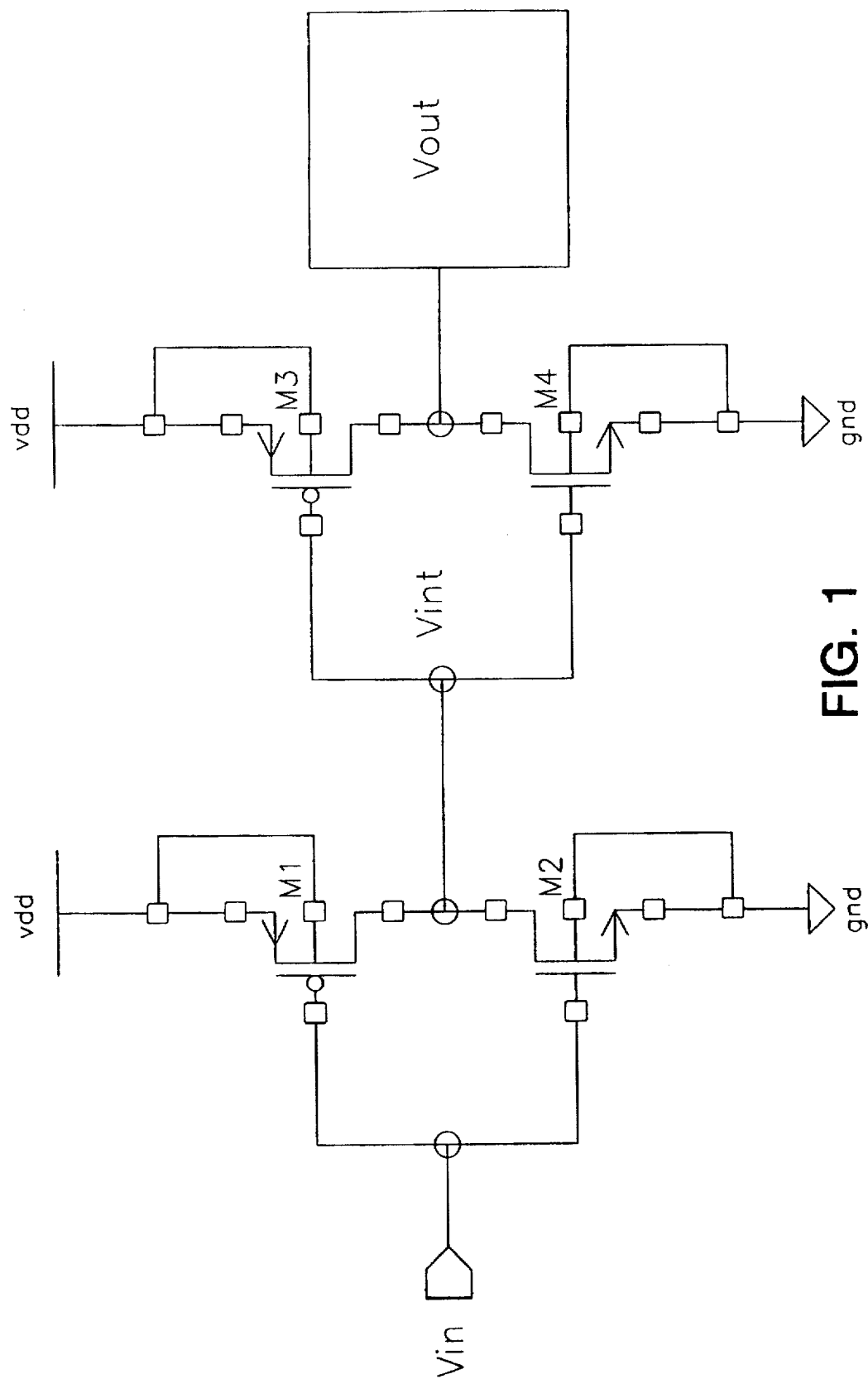
FIG. 1 is an electronic circuit schematic diagram of a typical prior art output driver.
Figure 2:
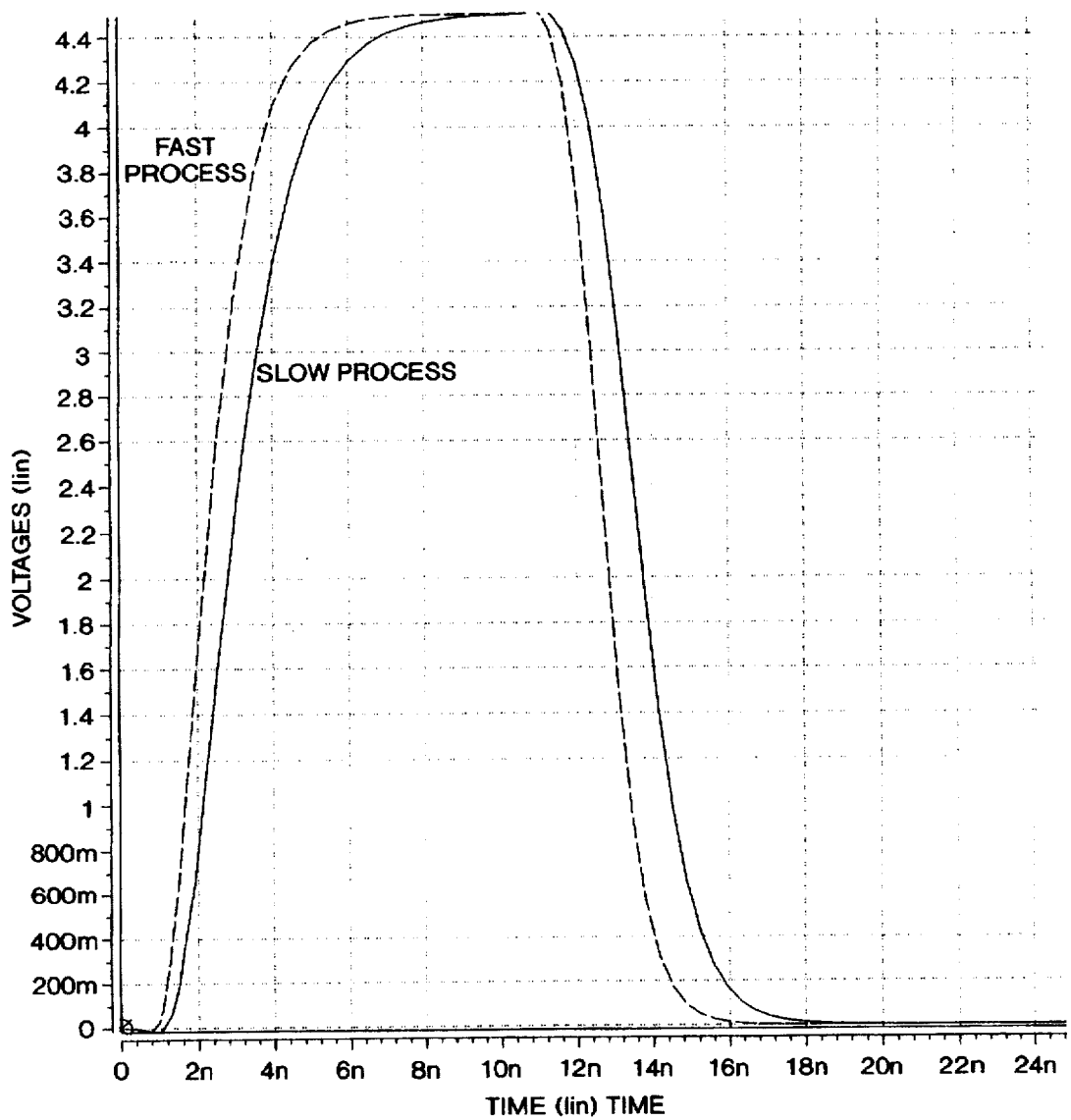
FIG. 2 depicts signal wave forms characteristic of the operation of the FIG. 1 output driver in both slow and fast process conditions.

FIG. 1 depicts a typical prior art integrated circuit output driver comprising a pair of inverters formed by field effect transistor ("FET") pairs M1, M2 (which together constitute the pre-driver) and M3, M4 (which together constitute the driver). $V_{in}$ is the signal supplied to the output driver by the integrated circuit's internal circuitry (not shown) and $V_{out}$ is the signal supplied by the output driver to an off-chip load (not shown). FIG. 2 depicts typical switching wave forms produced by the FIG. 1 output driver.

If $V_{in}$ is low (i.e. $V_{in}$=gnd), M1 is biased on and M2 is biased off. M1 pulls the pre-driver's output voltage $V_{int}$ high (i.e. $V_{int}$=vdd). With $V_{int}$ high, M3 is biased off and M4 is biased on, pulling the driver's output voltage $V_{out}$ low (i.e. $V_{out}$=$V_{in}$=gnd). If $V_{in}$ is high, M1 is biased off and M2 is biased on. M2 thus pulls $V_{int}$ low (i.e. $V_{int}$=gnd). With $V_{int}$ low, M3 is biased on and M4 is biased off, pulling $V_{out}$ high (i.e. $V_{out}$=$V_{in}$=vdd).

Of particular interest are the propagation delays inherent in the signal rise and fall times depicted in FIG. 2. The propagation delay for both the rising and falling edges is the time between the points at which $V_{in}$=2.5 volts and $V_{out}$=1.4 volts (assuming TTL logic levels; the principles of the invention apply to any levels). A "strong" driver produces steep rising and falling edges (illustrated by the solid lines in FIG. 2) and thus shorter propagation delays. A "weak" driver produces shallow rising and falling edges (illustrated by the dashed lines in FIG. 2) and thus longer propagation delays.

As $V_{out}$ rises there is a potential for creation of spikes on the power supply voltage signal level. If many different output drivers on the same integrated circuit chip are simultaneously attempting to drive output signals via a common power supply, the effect of such power supply spikes is magnified, potentially disturbing the point at which switching from a logic "0" to a logic "1" state (or vice versa) occurs. Accordingly, such spikes are desirably minimized. On the other hand, the output driver must be strong enough to accommodate the slowest anticipated signal propagation delays. This in turn implies the creation of larger power supply spikes as the same output driver handles faster rise time situations.

Figure 3:
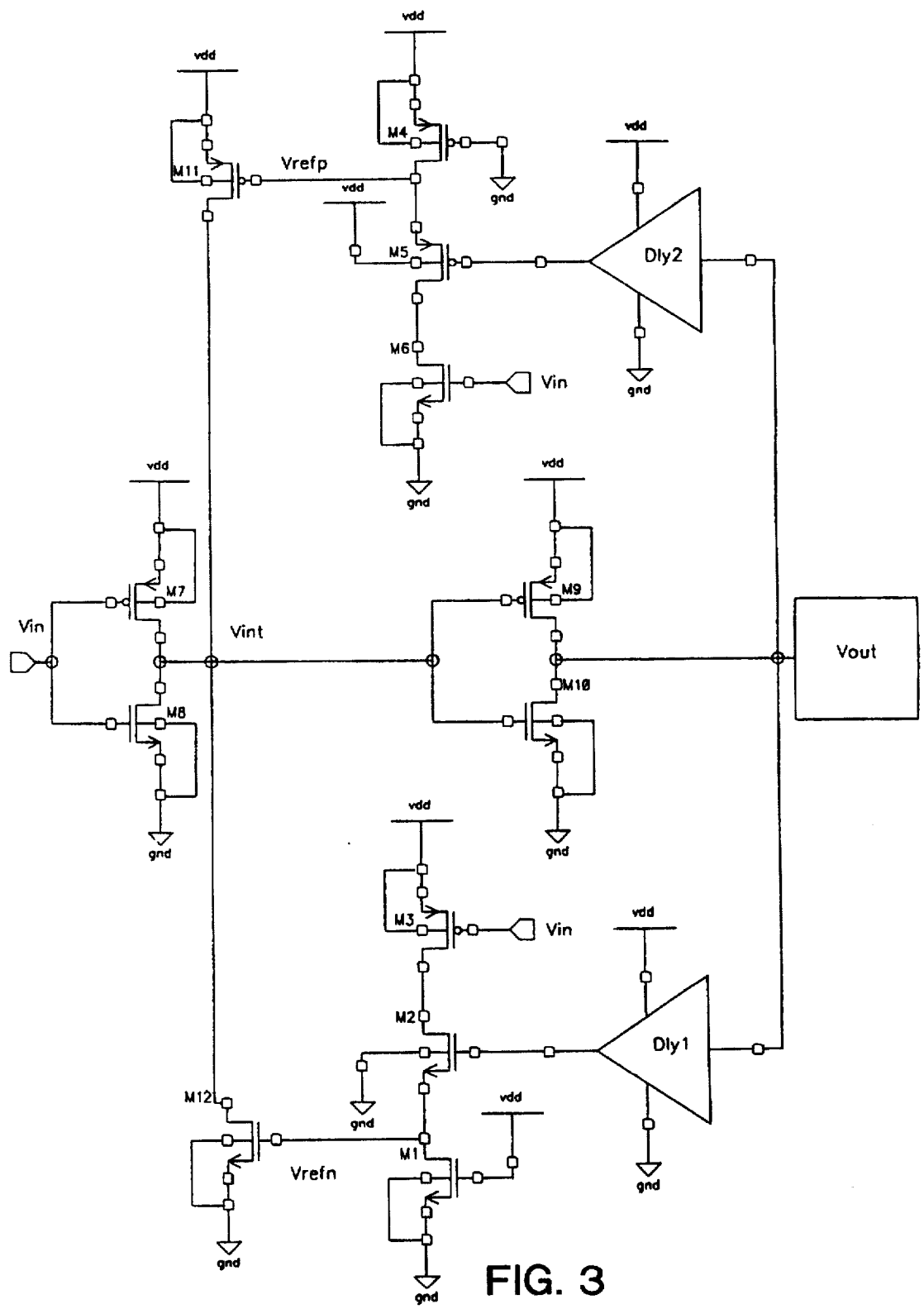
FIG. 3 is an electronic circuit schematic diagram of a preferred embodiment of the invention.
Figure 4A:
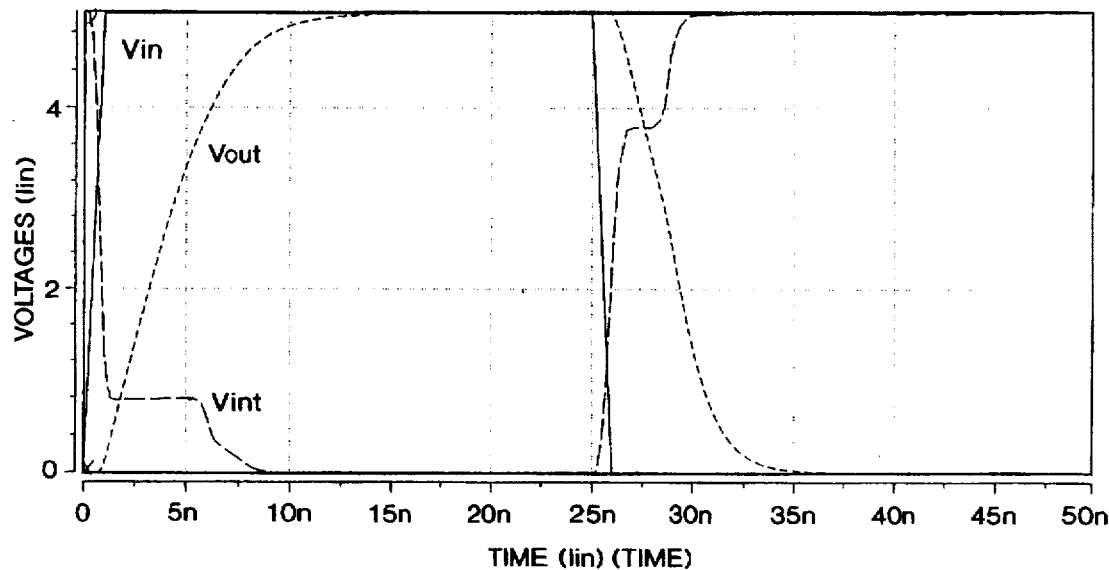
FIG. 4 is a signal timing diagram which illustrates the operation of the FIG. 3 output driver.
Figure 4B:
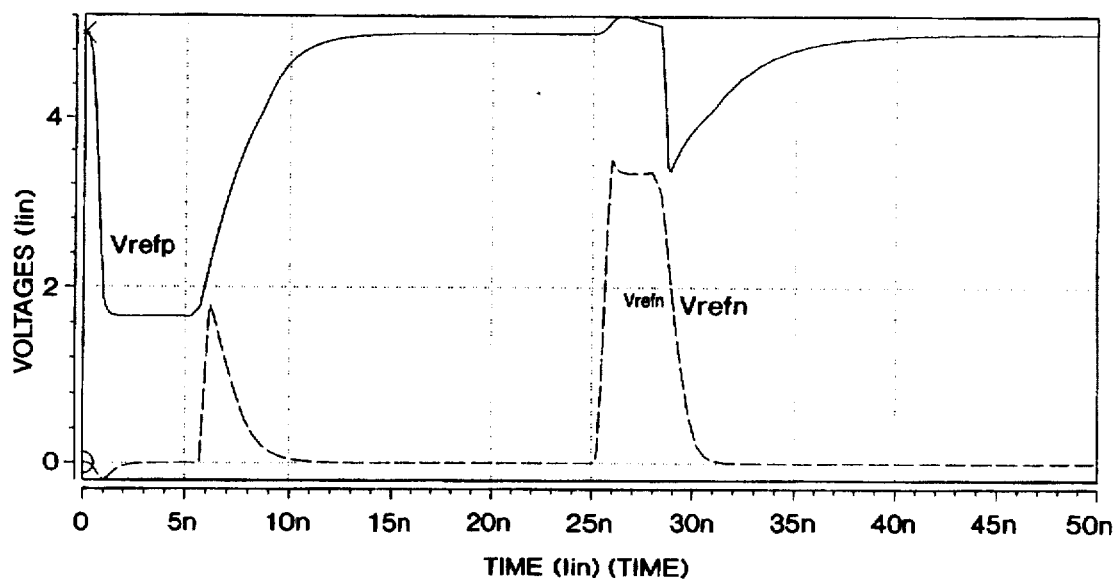
Figure 13:
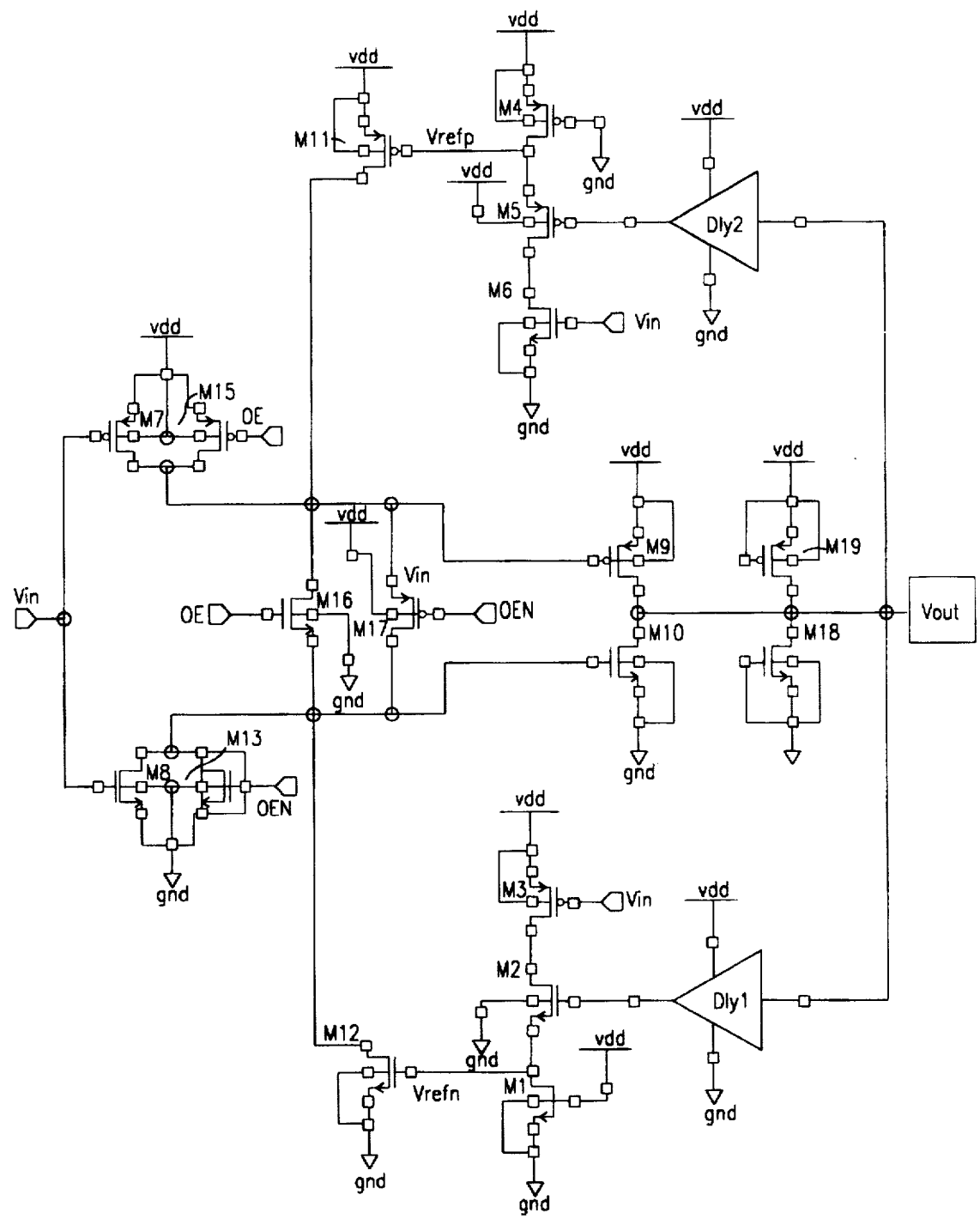
FIG. 13 is an electronic circuit schematic diagram which illustrates addition of tri-state circuitry and electrostatic discharge protection circuitry to the FIG. 3 output driver.

As depicted in FIG. 3, the preferred output driver consists of a pre-driver (FET's M7, M8, M11 and M12), a driver (FET's M9 and M10) and feedback circuitry to control the strength of the pre-driver (FET's M1–M6). To avoid obscuring details of the invention, all tri-state and electrostatic discharge protection circuitry is omitted from FIG. 3, but is shown in FIG. 13 and described below.

The pre-driver consists of an inverter formed by M7 and M8 in combination with M11 and M12 respectively. During the steady-state, when $V_{in}$ and $V_{out}$ are both high, $V_{refn}$ is at ground (i.e. gnd) and M12 is off. During a falling transient, as $V_{in}$ goes low M7 is biased on and M8 is biased off. M7 pulls the pre-driver's output voltage $V_{int}$ high (i.e. $V_{int}$=vdd). As $V_{int}$ goes high, M9 is biased off and M10 is biased on, such that $V_{out}$=$V_{in}$ (i.e. low). However, while M7 is pulling the pre-driver output high, M12 is biased on and resists M7's pull-up effect by trying to pull $V_{int}$ low. Until $V_{out}$ has switched, M2 is biased on and thus when M7 is biased on by $V_{in}$, M3 is also biased on by $V_{in}$ and passes vdd to M2. But, the gate of M1 is tied to vdd and M1 is therefore always on. Accordingly, M1 passes ground to the source of M2. Thus the voltage at M2's source (i.e. $V_{refn}$) is between ground and vdd, biasing M12 on and thereby reducing the sensitivity of the pre-driver to process variations. When $V_{out}$ switches to the low state, M2 is biased off and $V_{refn}$ returns to ground, biasing M12 off. Delay element Dly1 prevents deactivation of the feedback circuitry (i.e. M1, M2, M3) until $V_{out}$ has fully switched. M4, M5, M6 and Dly2 keep M11 off until $V_{out}$ has fallen.

In a "fast" process, $V_{int}$ and $V_{out}$ transition quickly. However, M3 turns on quickly, causing $V_{refn}$ to rise quickly, which causes M12 to turn on quickly and resist M7, thus slowing down $V_{int}$ and $V_{out}$. Accordingly, if process variations increase the pull-up strength of M7, M12 also increases in strength to counteract M7's increased strength. Conversely, if the pull-up strength of M7 weakens in a "slow" process, M12's pull-down strength also weakens.

In terms of effect on power supply variations during a falling transition (FIG. 8B), as vdd increases M7 tends to pull $V_{int}$ high more quickly. But, $V_{refn}$ (which varies between vdd and ground in proportion to vdd) counteracts the increased pull up effect by pulling $V_{int}$ down.

Now consider the operation of the FIG. 3 circuit during a rising transient. During the steady-state, when $V_{in}$ and $V_{out}$ are both low $V_{refp}$ is at vdd and M11 is off. During a rising transient, as $V_{in}$ goes high M8 is biased on and M7 is biased off. M8 pulls the pre-driver's output voltage $V_{int}$ low (i.e. $V_{int}$=gnd). As $V_{int}$ goes low, M9 is biased on and M10 is biased off, such that $V_{out}=V_{in}$ (i.e. high). However, while M8 is pulling the pre-driver output low, M11 is biased on and resists M8's pull-down effect by trying to pull $V_{int}$ high. Until $V_{out}$ has switched, M5 is biased on and thus when M8 is biased on by $V_{in}$, M6 is also biased on by $V_{in}$ and passes ground to M5. But, the gate of M4 is tied to ground and M4 is therefore always on. Accordingly, M4 passes vdd to the source of M5. Thus the voltage at M5's source (i.e. $V_{refp}$) is between ground and vdd, biasing M11 on and thereby reducing the sensitivity of the pre-driver to process variations. When $V_{out}$ switches to the high state, M5 is biased off and $V_{refp}$ returns to vdd, biasing M11 off. Delay element Dly2 prevents deactivation of the feedback circuitry (i.e. M4, M5, M6) until $V_{out}$ has fully switched. M1, M2, M3 and Dly1 keep M12 off until $V_{out}$ has risen.

In a "fast" process, $V_{int}$ and $V_{out}$ transition quickly. However, M6 turns on quickly, causing $V_{refp}$ to fall quickly, which causes M11 to turn on quickly and resist M8, thus slowing down $V_{int}$ and $V_{out}$. Accordingly, if process variations increase the pull-down strength of M8, M11 also increases in strength to counteract M8's increased strength. Conversely, if the pull-down strength of M8 weakens in a "slow" process, M11's pull-up strength also weakens.

The parametric process variation in M11, M12 has limited effect in countering variation in M7, M8. The reduction in sensitivity to process variations is primarily due to $V_{refn}$ and $V_{refp}$. These voltages provide a sensitivity to M11, M12 beyond that provided by transistor Beta or threshold. Hence, the variation of M11, M12 will be more pronounced then that of M7, M8.

In a "fast" process, the pulses generated at $V_{refn}$ and $V_{refp}$ become larger, thus increasing the drive strength of M12 and M11 respectively. This in turn reduces the strength of the pre-driver and slows the output driver down. In a "slow" process, the pulses generated at $V_{refn}$ and $V_{refp}$ become smaller, decreasing the drive strength of M12 and M11 respectively. This in turn increases the strength of the pre-driver and speeds the output driver up.

Figure 8A:
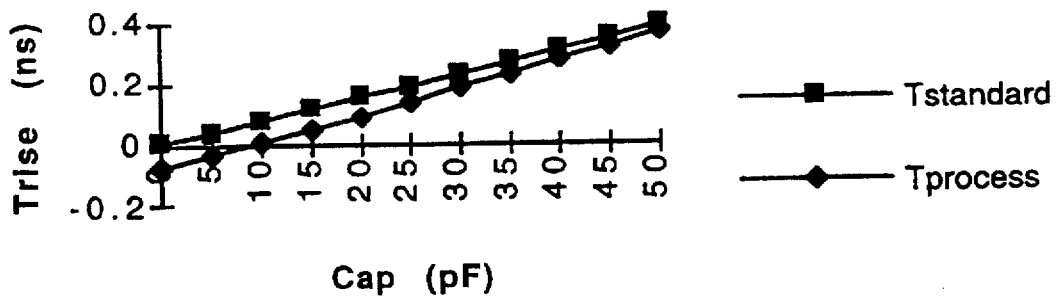
FIGS. 8A and 8B are similar to FIGS. 6A and 6B respectively, but show the effect of power supply variation between 4.5 volts and 5.5 volts, rather than process variations.

In terms of effect on power supply variations during a rising transition, as vdd decreases M8 tends to pull $V_{int}$ down more quickly. The effect of vdd is initially minimal since $V_{int}$ is pulled to ground, but increases as M9 detects a drop in $V_{int}$ and tries to pull $V_{out}$ up (at smaller values of vdd, M9 pulls $V_{out}$ up more slowly). The net effect is that signals propagate from $V_{in}$ to $V_{out}$ more slowly at lower values of vdd and more quickly at higher values of vdd. More particularly, at lower values of vdd, M11 tries to pull $V_{int}$ up to counter the pull down effect of M8. But, M11's pull up effect is relatively weak due to the lower value of vdd at M11's source. However, $V_{refp}$ (which varies between vdd and ground in inverse proportion to vdd) counters by causing M11 to pull up more strongly. As FIG. 8A shows, the net effect on M11 due to a variation of vdd at M11's source is greater than the effect of a variation in $V_{refp}$ at M11's gate, although the improvement is relatively small. The primary improvement in terms of the effect on power supply variations occurs during a falling transition, as discussed above in relation to FIG. 8B.

Figure 5:
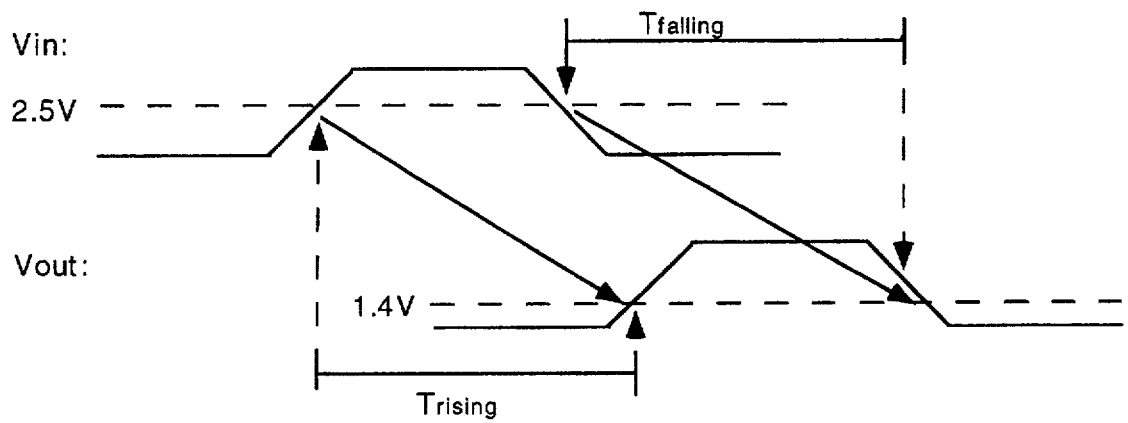
FIG. 5 is a signal timing diagram which illustrates propagation delay measurements made in deriving the simulation results depicted in FIGS. 6 through 12.

Computerized SPICE™ simulations were performed, using a 0.6 um CMOS technology, to demonstrate the FIG. 3 circuit's reduced propagation delay variation attributable to process variations. Propagation delays were measured from CMOS levels at the input of the pad to TTL levels at the output, as shown in FIG. 5.

The improvement in propagation delay over full process extremes varies, depending on the loading of the output driver. As the load increases, the driver portion of the propagation delay becomes larger in relation to the pre-driver portion. This reduces the effect of the improved pre-driver. This is evident from the simulation results depicted in FIGS. 6 through 12.

Figure 6A:
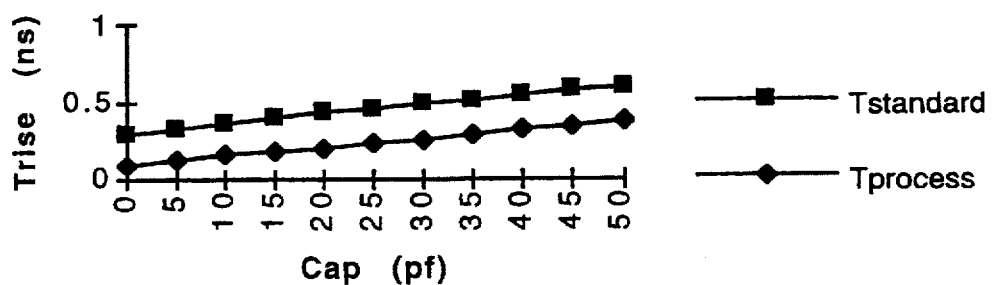
FIG. 6A is a graph which compares simulated rise time performance of the FIG. 1 prior art output driver ($T_{standard}$) and the FIG. 3 output driver ($T_{process}$) to show the difference between propagation delays for fast and slow process conditions under varying output loads.
Figure 6B:
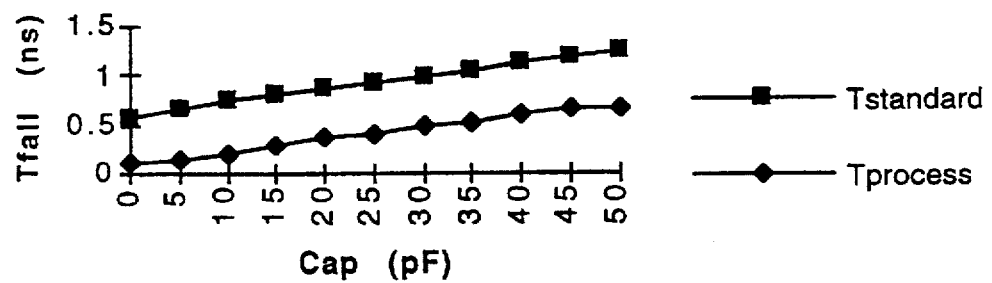
FIG. 6B similarly compares fall time performance of the FIG. 1 and FIG. 3 output drivers.

FIGS. 6A and 6B show the difference in propagation delays between a slow process and a fast process for varying loads. The FIG. 3 process-compensated driver ($T_{process}$) exhibits a smaller range than the FIG. 1 prior art driver ($T_{standard}$). In particular, FIG. 6A shows that the differential between the fastest and slowest propagation delays measured on the rising edge of the FIG. 3 circuit is consistently smaller than the corresponding differential in the FIG. 1 circuit. FIG. 6B similarly shows that the differential between the fastest and slowest propagation delays measured on the falling edge of the FIG. 3 circuit is also consistently smaller than the corresponding differential in the FIG. 1 circuit.

Figure 7A:
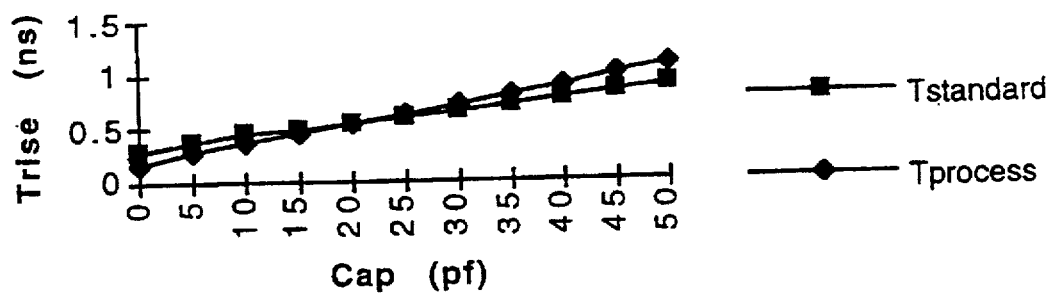
FIGS. 7A and 7B are similar to FIGS. 6A and 6B respectively, but show the effect of temperature variation between 125° C. and −40° C., rather than process variations.
Figure 7B:
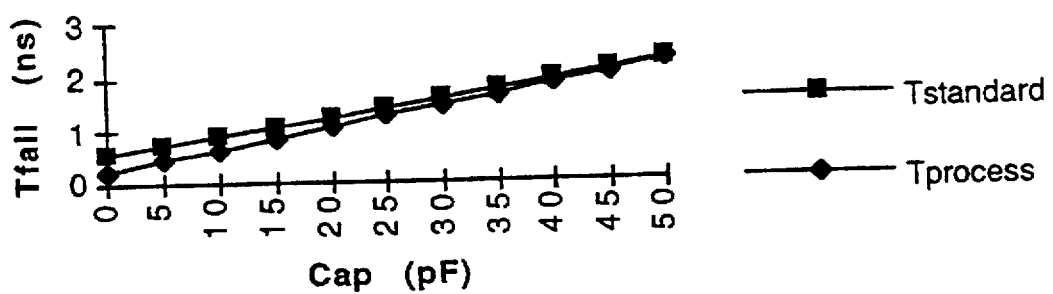

FIGS. 7A and 7B similarly show the difference in propagation delays between a slow process and a fast process for temperature variations between 125° C. and −40° C., and varying loads. The FIG. 3 process-compensated driver ($T_{process}$) exhibits minimal improvement, if any, over the FIG. 1 circuit.

Figure 8B:
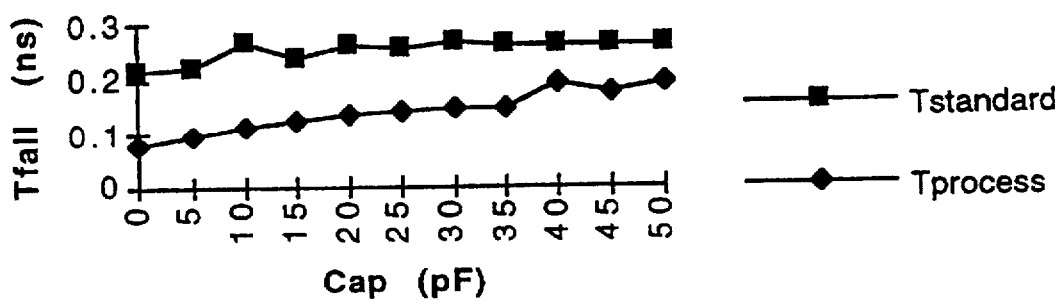

FIGS. 8A and 8B show the difference in propagation delays between a slow process and a fast process for power supply variations between 4.5 volts and 5.5 volts, and varying loads. Minimal improvement was found on the rising edge (FIG. 8A). However, significant improvement appears on the falling edge (FIG. 8B). This will result in less duty cycle distortion over voltage changes.

Figure 9A:
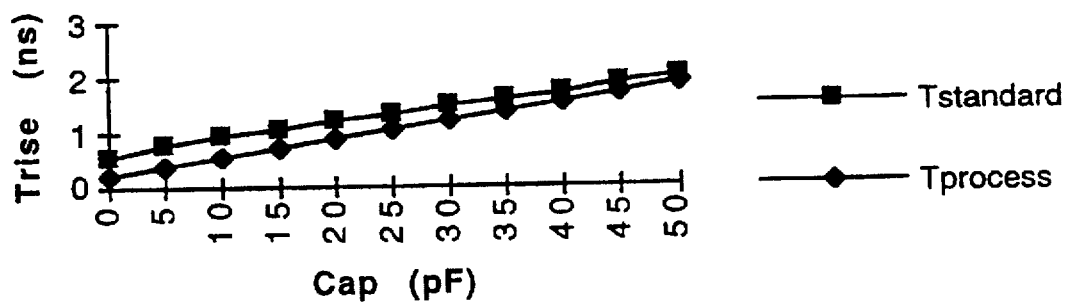
FIGS. 9A and 9B are similar to FIGS. 6A and 6B respectively, additionally showing the effect of both temperature variation between 125° C. and −40° C. and the effect of power supply variation between 4.5 volts and 5.5 volts.
Figure 9B:
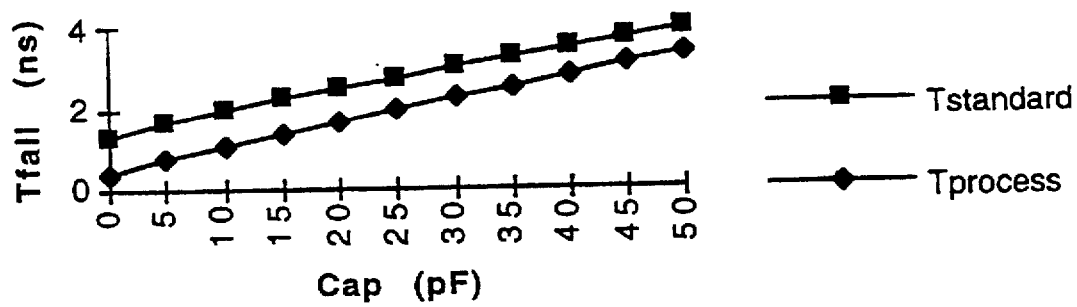

FIGS. 9A and 9B show the difference in propagation delays between a slow process and a fast process for both temperature variations between 125° C. and −40° C., power supply variations between 4.5 volts and 5.5 volts, with varying loads. The FIG. 3 process-compensated driver ($T_{process}$) again exhibits a smaller range than the FIG. 1 prior art driver.

Figure 10A:
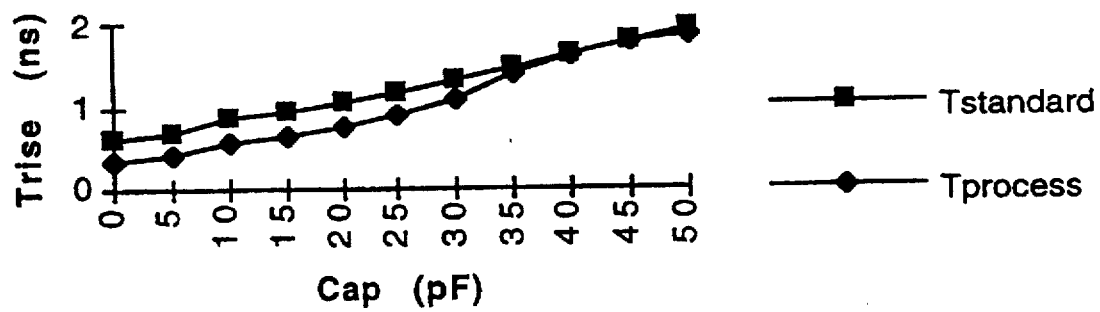
FIGS. 10A and 10B are similar to FIGS. 9A and 9B respectively, additionally showing the effect of 10 nH of package inductance.
Figure 10B:
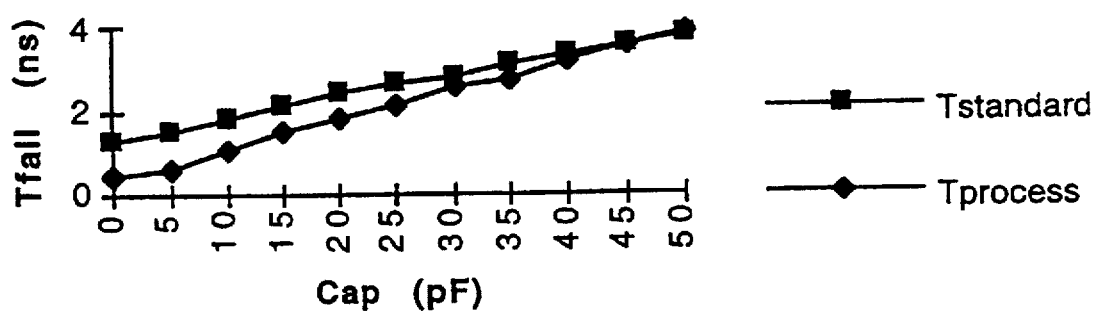

FIGS. 10A and 10B show the difference in propagation delays between a slow process and a fast process for temperature variations between 125° C. and −40° C., power supply variations between 4.5 volts and 5.5 volts, and 10 nH of package inductance. Performance of the FIG. 3 process-compensated driver is again found to be superior to that of the FIG. 1 prior art driver, in that the differential between the fastest and slowest propagation delays measured on the both the rising and falling edges of the FIG. 3 circuit is consistently smaller than or equal to the corresponding differential in the FIG. 1 circuit.

Figure 11A:
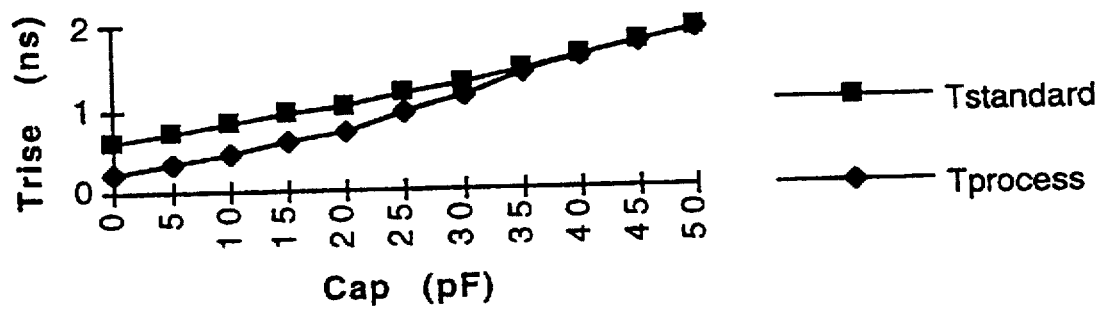
FIGS. 11A and 11B are similar to FIGS. 9A and 9B respectively, additionally showing the effect of powering the pre-driver and all compensation circuitry with a different power supply than that used to power the final output driver.
Figure 11B:
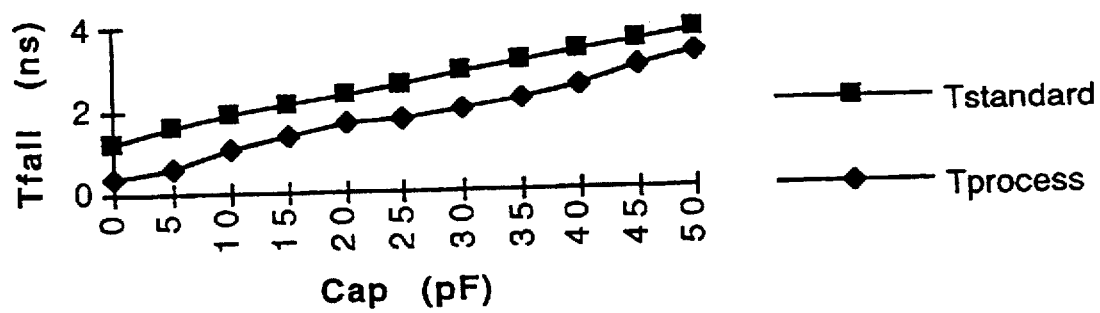

FIGS. 11A and 11B show the difference in propagation delays between a slow process and a fast process for temperature variations between 125° C. and −40° C., and power supply variations between 4.5 volts and 5.5 volts, with the pre-driver and all compensation circuitry powered off a different supply then the output driver. Again, the process-compensated FIG. 3 driver exhibits superior performance to that of the FIG. 1 prior art driver.

Figure 12A:
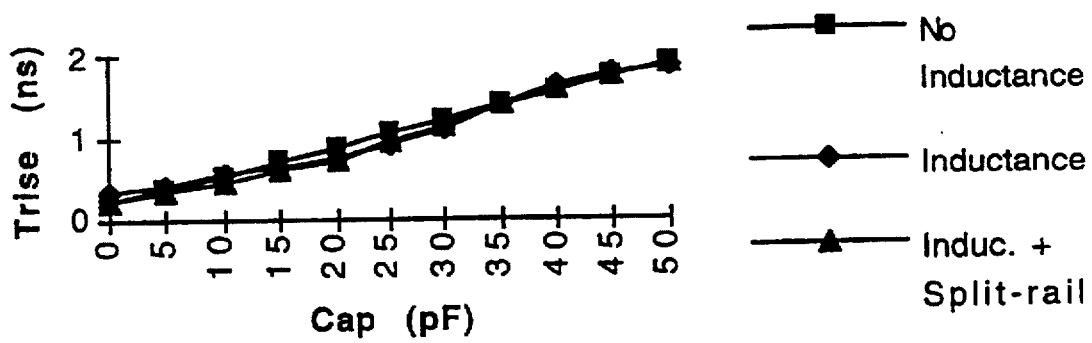
FIGS. 12A and 12B are similar to FIGS. 9A and 9B respectively, additionally showing the effect of (i) no package inductance, (ii) 10 nH of package inductance, and 10 nH package inductance with split power supply as in FIGS. 11A and 11B.
Figure 12B:
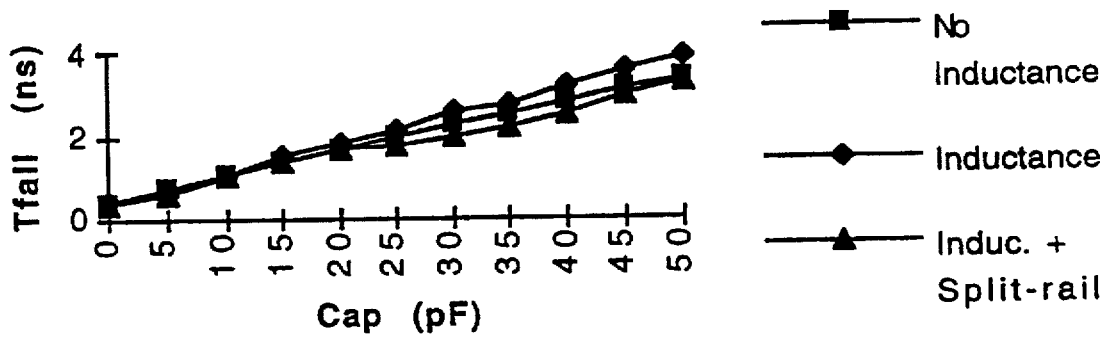

FIGS. 12A and 12B show the difference in propagation delays between a slow process and a fast process (for the FIG. 3 circuit only) for temperature variations between 125° C. and −40° C., power supply variations between 4.5 volts and 5.5 volts, for three cases: (i) no package inductance, (ii) 10 nH package inductance, and (iii) 10 nH package inductance with a split power supply. As FIG. 12A shows, the differences between the three cases are negligible for the rising edge. On the falling edge (FIG. 12B) the inductance detracted from performance. However, the split power supply rail actually improved performance in comparison to the no-inductance case.

As will be apparent to those skilled in the art in the light of the foregoing disclosure, many alterations and modifications are possible in the practice of this invention without departing from the spirit or scope thereof. For example, FIG.

13 depicts the preferred output driver with tri-state circuitry and electrostatic discharge protection circuitry added. When OE (output enable) is low and OEN (same as output enable, but with negative polarity) is high, M16 and M17 are biased off, breaking the connection between M7 and M8. M13 pulls the drain of M8 low and M15 pulls the drain of M7 high and the device is tri-stated. When OE is high and OEN is low the device functions normally. M18 and M19 are added for electrostatic discharge protection. They are only necessary for weak drivers where the width of M9 and M10 is small. Otherwise an electrostatic discharge implant of the drain of M10 is sufficient. Accordingly, the scope of the invention is to be construed in accordance with the substance defined by the following claims.

What is claimed is:

1. An integrated circuit output driver for producing an output signal $V_{out}$ as an increased drive strength replica of an input signal $V_{in}$, said output driver comprising:

(a) a pre-driver for receiving said $V_{in}$ signal and for producing a signal $V_{int}$ as an inverted replica of said $V_{in}$ signal;

(b) a driver having an input and an output, said input electrically connected to an output of said pre-driver, said driver for receiving said $V_{int}$ signal at said input and for producing said $V_{out}$ signal at said output as an inverted, strengthened replica of said $V_{int}$ signal;

(c) a first feedback circuit electrically connected between said driver input and output, said first feedback circuit for producing a pull-down signal having a strength proportional to propagation delay of a falling edge of said $V_{in}$ signal and for applying said pull-down signal to said driver input in response to said falling edge of said $V_{in}$ signal;

(d) a second feedback circuit electrically connected between said driver input and output, said second feedback circuit for producing a pull-up signal having a strength proportional to propagation delay of a rising edge of said $V_{in}$ signal and for applying said pull-up signal to said driver input in response to said rising edge of said $V_{in}$ signal;

wherein:

(e) said first feedback circuit:
   (i) further comprises a first switch biased off by a falling edge of said $V_{out}$ signal;
   (ii) conducts a logic high signal from an input port of said first switch to an output port of said first switch before said $V_{out}$ signal switches to a logic low state, thereby producing a positive pulse output signal $V_{refn}$ at said first switch output port;

(f) said second feedback circuit:
   (i) further comprises a second switch biased off by a rising edge of said $V_{out}$ signal; and,
   (ii) conducts a logic low signal from an input port of said second switch to an output port of said second switch before said $V_{out}$ signal switches to a logic high state, thereby producing a negative pulse output signal $V_{refp}$ at said second switch output port.

2. An output driver as defined in claim 1, wherein:

(a) said first feedback circuit further comprises a third switch electrically connected between said first switch output port and said driver input, said third switch biased on by said $V_{refn}$ signal to pull said driver input down with a strength proportional to said $V_{refn}$ signal strength; and, (b) said second feedback circuit further comprises a fourth switch electrically connected between said second switch output port and said driver input, said fourth switch biased on by said $V_{refp}$ signal to pull said driver input up with a strength proportional to said $V_{refp}$ signal strength.

3. An output driver as defined in claim 2, wherein:

(a) said first feedback circuit further comprises a first delay element for delaying biasing of said first switch off until after said first switch is biased on and said $V_{out}$ signal has switched to said logic low state; and, (b) said second feedback circuit further comprises a second delay element for delaying biasing of said second switch off until after said second switch is biased on and said $V_{out}$ signal has switched to said logic high state.

4. An output driver as defined in claim 2, wherein said switches are field effect transistors.

5. An integrated circuit output driver for producing an output signal $V_{out}$ as an increased drive strength replica of an input signal $V_{in}$, said output driver comprising:

(a) a pre-driver for receiving said $V_{in}$ signal and for producing a signal $V_{int}$ as an inverted replica of said $V_{in}$ signal;

(b) a driver having an input and an output, said input electrically connected to an output of said pre-driver, said driver for receiving said $V_{int}$ signal at said input and for producing said $V_{out}$ signal at said output as an inverted, strengthened replica of said $V_{int}$ signal;

(c) a first feedback circuit electrically connected between said driver input and output, said first feedback circuit for producing a pull-down signal having a strength proportional to propagation delay of a falling edge of said $V_{in}$ signal and for applying said pull-down signal to said driver input in response to said falling edge of said $V_{in}$ signal;

(d) a second feedback circuit electrically connected between said driver input and output, said second feedback circuit for producing a pull-up signal having a strength proportional to propagation delay of a rising edge of said $V_{in}$ signal and for applying said pull-up signal to said driver input in response to said rising edge of said $V_{in}$ signal;

wherein:

(e) said first feedback circuit further comprises a first switch having an input port, and output port electrically connected to a logic low signal, and a switch port, said first switch port electrically connected to said driver output, said first swtich biased off by a falling edge of said $V_{out}$ signal and conducting a logic high signal from said first switch input port to said first switch output port before said $V_{out}$ signal switches to a logic low state, thereby producing a positive pulse output signal $V_{refn}$ at said first switch output port; and, (f) said second feedback circuit further comprises a second switch having an input port, an output port electrically connected to a logic high signal, and a switch port, said second switch port electrically connected to said driver output, said second switch biased off by a rising edge of said $V_{out}$ signal and conducting a logic low signal from said switch input port to said second switch output port before said $V_{out}$ signal switches to a logic high state, thereby producing a negative pulse output signal $V_{refp}$ at said second switch output port.

6. An integrated circuit output driver for producing an output signal $V_{out}$ as an increased drive strength replica of an input signal $V_{in}$, said output driver comprising:

(a) a pre-driver for receiving said $V_{in}$ signal and for producing a signal $V_{int}$ as an inverted replica of said $V_{in}$ signal;

(b) a driver having an input and an output, said input electrically connected to an output of said pre-driver, said driver for receiving said $V_{int}$ signal at said input and for producing said $V_{out}$ signal at said output as an inverted, strengthened replica of said $V_{int}$ signal;

(c) a first feedback circuit electrically connected between said driver input and output, said first feedback circuit for producing a pull-down signal having a strength proportional to propagation delay of a falling edge of said $V_{in}$ signal and for applying said pull-down signal to said driver input in response to said falling edge of said $V_{in}$ signal;

(d) a second feedback circuit electrically connected between said driver input and output, said second feedback circuit for producing a pull-up signal having a strength proportional to propagation delay of a rising edge of said $V_{in}$ signal and for applying said pull-up signal to said driver input in response to said rising edge of said $V_{in}$ signal;

wherein:

(e) said first feedback circuit:

(i) further comprises a first nmos FET (M2) having a drain electrically connected to receive a logic high signal, a source electrically connected to receive a logic low signal, and a gate electrically connected to said driver output to bias said first nmos FET (M2) off by a falling edge of said $V_{out}$ signal;

(ii) conducts said logic high signal from said first nmos FET (M2) drain to said first nmos FET (M2) source before said $V_{out}$ signal switches to a logic low state, thereby producing a positive pulse output signal $V_{refn}$ at said first nmos FET (M2) source;

(f) said second feedback circuit:

(i) further comprises a first pmos FET (M5) having a drain electrically connected to receive said logic low signal, a source electrically connected to receive said logic high signal, and a gate electrically connected to said driver output to bias said first pmos FET (M5) off by a rising edge of said $V_{out}$ signal; and, (ii) conducts said logic low signal from said first pmos FET (M5) drain to said first pmos FET (M5) source before said $V_{out}$ signal switches to a logic high state, thereby producing a negative pulse output signal $V_{refp}$ at said first pmos FET (M5) source.

7. An output driver as defined in claim 6, wherein:

(a) said first feedback circuit further comprises a second nmos FET (M12) electrically connected between said first nmos FET (M2) source and said driver input, said second nmos FET (M12) biased on by said $V_{refn}$ signal to pull said driver input down with a strength proportional to said $V_{refn}$ signal strength; and, (b) said second feedback circuit further comprises a second pmos FET (M11) connected between said first pmos FET (M5) source and said driver input, said second pmos FET (M11) biased on by said $V_{refp}$ signal to pull said driver input up with a strength proportional to said $V_{refp}$ signal strength.

8. An output driver as defined in claim 6, wherein:

(a) said first feedback circuit further comprises a second nmos FET (M12) having a gate electrically connected to said first nmos FET (M2) source, a source electrically connected to receive said logic low signal, and a drain electrically connected to said driver input, said second nmos FET (M12) biased on by said $V_{refn}$ signal to pull said driver input down with a strength proportional to said $V_{refn}$ signal strength; and, (b) said second feedback circuit further comprises a second pmos FET (M11) having a gate electrically connected to said first pmos FET (M5) source, a source electrically connected to receive said logic high signal, and a drain electrically connected to said driver input, said second pmos FET (M11) biased on by said $V_{refp}$ signal to pull said driver input up with a strength proportional to said $V_{refp}$ signal strength.

9. An output driver as defined in claim 8, wherein:

(a) said first feedback circuit further comprises a third nmos FET (M1) having a gate electrically connected to receive said logic high signal, a drain electrically connected to said first nmos FET (M2) source, and a source electrically connected to receive said logic low signal; and, (b) said second feedback circuit further comprises a third pmos FET (M4) having a gate electrically connected to receive said logic low signal, a drain electrically connected to said first pmos FET (M5) source, and a source electrically connected to receive said logic high signal.

10. An output driver as defined in claim 9, wherein:

(a) said first feedback circuit further comprises a fourth pmos FET (M3) having a gate electrically connected to receive said $V_{in}$ signal, a source electrically connected to receive said logic high signal, and a drain electrically connected to said first nmos FET (M2) drain; and, (b) said second feedback circuit further comprises a fourth nmos FET (M6) having a gate electrically connected to receive said $V_{in}$ signal, a source electrically connected to receive said logic low signal, and a drain electrically connected to said first pmos FET (M5) drain.

11. An output driver as defined in claim 10, wherein said pre-driver further comprises:

(a) a fifth pmos FET (M7) having a gate electrically connected to receive said $V_{in}$ signal, a source electrically connected to receive said logic high signal, and a drain electrically connected to said driver input;

(b) a fifth nmos FET (M8) having a gate electrically connected to receive said $V_{in}$ signal, a source electrically connected to receive said logic low signal, and a drain electrically connected to said driver input;

said output driver further comprising:

(c) a sixth nmos FET (M16) having a gate electrically connected to receive an output enable signal, a source electrically connected to said fifth nmos FET (M8) drain and a drain electrically connected to said fifth pmos FET (M7) drain;

(d) a sixth pmos FET (M17) having a gate electrically connected to receive a negative polarity output enable signal, a source electrically connected to said fifth pmos FET (M7) drain and a drain electrically connected to said fifth nmos FET (M8) drain;

(e) a seventh nmos FET (M13) having a gate electrically connected to receive said negative polarity output enable signal, a source electrically connected to receive said logic low signal and a drain electrically connected to said driver input; and, (f) a seventh pmos FET (M15) having a gate electrically connected to receive said output enable signal, a source electrically connected to receive said logic high signal and a drain electrically connected to said driver input.

12. An output driver as defined in claim 11, wherein said driver further comprises:

(a) an eighth nmos FET (M10) having a gate electrically connected to said fifth nmos FET (M8) drain, a source electrically connected to receive said logic low signal and a drain;

(b) an eighth pmos FET (M9) having a gate electrically connected to said fifth pmos FET (M7) drain, a source electrically connected to receive said logic high signal and a drain electrically connected to said eighth nmos FET (M10) drain;

said output driver further comprising:

(c) a ninth nmos FET (M18) having a gate electrically connected to receive said logic low signal, a source electrically connected to receive said logic low signal and a drain electrically connected to said eighth pmos FET (M9) drain and to said eighth nmos FET (M10) drain; and, (c) a ninth pmos FET (M19) having a gate electrically connected to receive said logic high signal, a source electrically connected to receive said logic high signal and a drain electrically connected to said eighth pmos FET (M9) drain and to said eighth nmos FET (M10) drain.

13. An integrated circuit output driver for producing an output signal $V_{out}$ as an increased drive strength replica of an input signal $V_{in}$, said output driver comprising:

(a) a pre-driver for receiving said $V_{in}$ signal and for producing a signal $V_{int}$ as an inverted replica of said $V_{in}$ signal;

(b) a driver having an input and an output, said input electrically connected to an output of said pre-driver, said driver for receiving said $V_{int}$ signal at said input and for producing said $V_{out}$ signal at said output as an inverted, strengthened replica of said $V_{int}$ signal;

(c) a first feedback circuit electrically connected between said driver input and output, said first feedback circuit comprising first, second, and third nmos FETs (M2, M12, M1) and a fourth pmos FET (M3);

(i) said first nmos FET (M2) having a gate electrically connected to said driver output, a source, and a drain;

(ii) said second nmos FET (M12) having a gate electrically connected to said first nmos FET (M2) source, a source electrically connected to receive a logic low signal, and a drain electrically connected to said driver input;

(iii) said third nmos FET (M1) having a gate electrically connected to receive a logic high signal, a drain electrically connected to said first nmos FET (M2) source, and a source electrically connected to receive said logic low signal;

(iv) said fourth pmos FET (M3) having a gate electrically connected to receive said $V_{in}$ signal, a source electrically connected to receive said logic high signal, and a drain electrically connected to said first nmos FET (M2) drain;

(d) a second feedback circuit electrically connected between said driver input and output, said second feedback circuit comprising first, second, and third pmos FETs (M5, M11, M4) and a fourth nmos FET (M6);

(i) said first pmos FET (M5) having a gate electrically connected to said driver output, a source, and a drain;

(ii) said second pmos FET (M11) having a gate electrically connected to said first pmos FET (M5) source, a source electrically connected to receive said logic high signal, and a drain electrically connected to said driver input;

(iii) said third pmos FET (M4) having a gate electrically connected to receive said logic low signal, a drain electrically connected to said first pmos FET (M5) source, and a source electrically connected to receive said logic high signal; and, (iv) said fourth nmos FET (M6) having a gate electrically connected to receive said $V_{in}$ signal, a source electrically connected to receive said logic low signal, and a drain electrically connected to said first pmos FET (M5) source.

14. An output driver as defined in claim 13, wherein said pre-driver further comprises:

(a) a fifth pmos FET (M7) having a gate electrically connected to receive said $V_{in}$ signal, a source electrically connected to receive said logic high signal, and a drain electrically connected to said driver input;

(b) a fifth nmos FET (M8) having a gate electrically connected to receive said $V_{in}$ signal, a source electrically connected to receive said logic low signal, and a drain electrically connected to said driver input;

said output driver further comprising:

(c) a sixth nmos FET (M16) having a gate electrically connected to receive an output enable signal, a source electrically connected to said fifth nmos FET (M8) drain and a drain electrically connected to said fifth pmos FET (M7) drain;

(d) a sixth pmos FET (M17) having a gate electrically connected to receive a negative polarity output enable signal, a source electrically connected to said fifth pmos FET (M7) drain and a drain electrically connected to said fifth nmos FET (M8) drain;

(e) a seventh nmos FET (M13) having a gate electrically connected to receive said negative polarity output enable signal, a source electrically connected to receive said logic low signal and a drain electrically connected to said driver input; and, (f) a seventh pmos FET (M15) having a gate electrically connected to receive said output enable signal, a source electrically connected to receive said logic high signal and a drain electrically connected to said driver input.

15. An output driver as defined in claim 14, wherein said driver further comprises:

(a) an eighth nmos FET (M10) having a gate electrically connected to said fifth nmos FET (M8) drain, a source electrically connected to receive said logic low signal and a drain;

(b) an eighth pmos FET (M9) having a gate electrically connected to said fifth pmos FET (M7) drain, a source electrically connected to receive said logic high signal and a drain electrically connected to said eighth nmos FET (M10) drain;

said output driver further comprising:

(c) a ninth nmos FET (M18) having a gate electrically connected to receive said logic low signal, a source electrically connected to receive said logic low signal and a drain electrically connected to said eighth pmos FET (M9) drain and to said eighth nmos FET (M10) drain; and, (c) a ninth pmos FET (M19) having a gate electrically connected to receive said logic high signal, a source electrically connected to receive said logic high signal and a drain electrically connected to eighth pmos FET (M9) drain and to said eighth nmos FET (M10) drain.

* * * * *